United States Patent
Goren et al.

(10) Patent No.: US 7,512,911 B1
(45) Date of Patent: Mar. 31, 2009

(54) METHOD FOR CREATING A PARAMETERIZED CELL LIBRARY DUAL-LAYERED RULE SYSTEM FOR RAPID TECHNOLOGY MIGRATION

(75) Inventors: Lidor Goren, Netanya (IL); Alex Raphayevich, Kiryat Ekron (IL); Tamara Aviv, Ramat-Gan (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/204,074

(22) Filed: Sep. 4, 2008

(51) Int. Cl.
*G06F 17/50* (2006.01)
(52) U.S. Cl. .................. 716/3; 716/5; 716/18; 703/16
(58) Field of Classification Search .................. 716/3, 716/5, 18; 703/16
See application file for complete search history.

(56) References Cited

U.S. PATENT DOCUMENTS

| | | | |
|---|---|---|---|
| 5,432,707 A | 7/1995 | Leung | |
| 5,920,486 A | 7/1999 | Beahm et al. | |
| 6,298,469 B1 | 10/2001 | Yin | |
| 6,574,779 B2 | 6/2003 | Allen et al. | |
| 7,028,272 B2 | 4/2006 | Mandal et al. | |
| 7,124,382 B1 * | 10/2006 | Eccles et al. | 716/5 |
| 7,302,651 B2 | 11/2007 | Allen et al. | |
| 7,325,209 B2 | 1/2008 | Mitra et al. | |

OTHER PUBLICATIONS

"Technology Migration Using Migratemap.il,"*Virtuoso Layout Migrate User Guide, Product Version 5.0*, pp. 1-5, Aug. 6, 2005. <http://www.ece.uci.edu/eceware/cadence/migrate/chap4.html>.

* cited by examiner

*Primary Examiner*—Phallaka Kik
(74) *Attorney, Agent, or Firm*—Locke Lord Bissell and Liddell LLP

(57) ABSTRACT

A parameterized cell library including variable names corresponding to characteristics of components on an integrated circuit design may reference variable values stored in a first rule layer via internally used rule names stored in a second rule layer. The first and second rule layers may be stored as association tables. The first rule layer may store rule names corresponding to one or more geometric constraints of the integrated circuit design, and the rule names may directly reference variable values derived from a technology manual. The second rule layer may store internally used rule names corresponding to rule names stored in the first rule layer, and the internally used rule names may reference the rule names stored in the first rule layer.

1 Claim, 2 Drawing Sheets

METHOD FOR CREATING A PARAMETERIZED CELL LIBRARY DUAL-LAYERED RULE SYSTEM FOR RAPID TECHNOLOGY MIGRATION

FIELD OF THE INVENTION

The present invention generally relates to integrated circuit design and, more specifically, to migrating an integrated circuit design from one technology to another technology.

BACKGROUND

Circuit design involves the design and placement of many different types of components that comprise a complete circuit. Such components range from simple metal shapes, to transistors to full logic gates. A circuit may be comprised of hundreds to hundreds of thousands or millions of such components. Many of these components may have variabilities in size, structure or characteristics. Creating parameterized cell libraries is one way to automate the circuit design process. For example, if a circuit requires N different varieties of a specific gate (e.g., many inverters of different signal driving strength), the similarities that all the different inverters share may be exploited (e.g., they are all inverters, just with different sizes) to describe just one inverter which contains all of those similarities. Then the differences may be defined in a parameterized way (e.g., assign a variable to describe them with its value).

However, the construction of such a parameterized cell library, or the tailoring of such a library to a new project or technology (e.g., 45 nm Bulk CMOS, 45 nm SOI CMOS, etc.) presents a problem that the code used to describe the parameterized components has to take into account many physical variables that assume different values per project or technology. Thus, moving from one technology (e.g., 45 nm Bulk CMOS) to another (e.g., 45 nm SOI CMOS) may require extensive changes in the code, which translate to additional development and debugging time. Furthermore, even when not migrating to a new technology, there are often, within the early stages of a technology, changes in the rules (that result from gathered experience) which also require such changes.

SUMMARY

The present system and method provide for creating a dual-layered rule system for migrating an integrated circuit design layout from one technology to another technology.

A method for creating a dual-layered rule system for migrating an integrated circuit design layout from one technology to another technology generates a parameterized cell library which includes variable names corresponding to characteristics of components of the integrated circuit design. A first rule layer includes rule names corresponding to one or more geometric constraints of the integrated circuit design with direct references to variable values derived from a technology manual. A second rule layer includes internally used rule names corresponding to the rule names in the first rule layer. Internally used rule names in the second rule layer are referred to the rule names in the first rule layer. The variable names from the parameterized cell library are referred to the variable values in the first rule layer via the internally used rule names in the second rule layer.

According to an exemplary embodiment, the previously described problems may be solved by a method for creating a dual-layered rule system for migrating an integrated circuit design layout from one technology to another technology, the method comprising: generating a parameterized cell library including variable names corresponding to characteristics of components of the integrated circuit design; generating and storing, as an association table, a first rule layer including rule names corresponding to one or more geometric constraints of the integrated circuit design with direct references to variable values derived from a technology manual; generating and storing, as an association table, a second rule layer including internally used rule names corresponding to the rule names in the first rule layer; referencing the internally used rule names in the second rule layer to the rule names in the first rule layer; referencing the variable names from the parameterized cell library to the variable values in the first rule layer via the internally used rule names in the second rule layer.

BRIEF DESCRIPTION OF THE DRAWINGS

The disclosure will be further understood from the following detailed description of one or more embodiments, taken in conjunction with appended drawings, in which.

DETAILED DESCRIPTION

In the following description of the various examples, reference is made to the accompanying drawings which are illustrations of various embodiments in which the method may be practiced.

The present disclosure is directed to a method for creating a dual-layered rule system for migrating an integrated circuit design layout from one technology to another technology. The method may be embodied on a computer-readable storage medium which may be used on any suitable hardware platform such as a desktop computer, laptop computer, personal digital assistant (PDA) or similar device.

An exemplary dual-layered rule system is described below in conjunction with the overview illustrated in FIG. 1.

Figure 1:
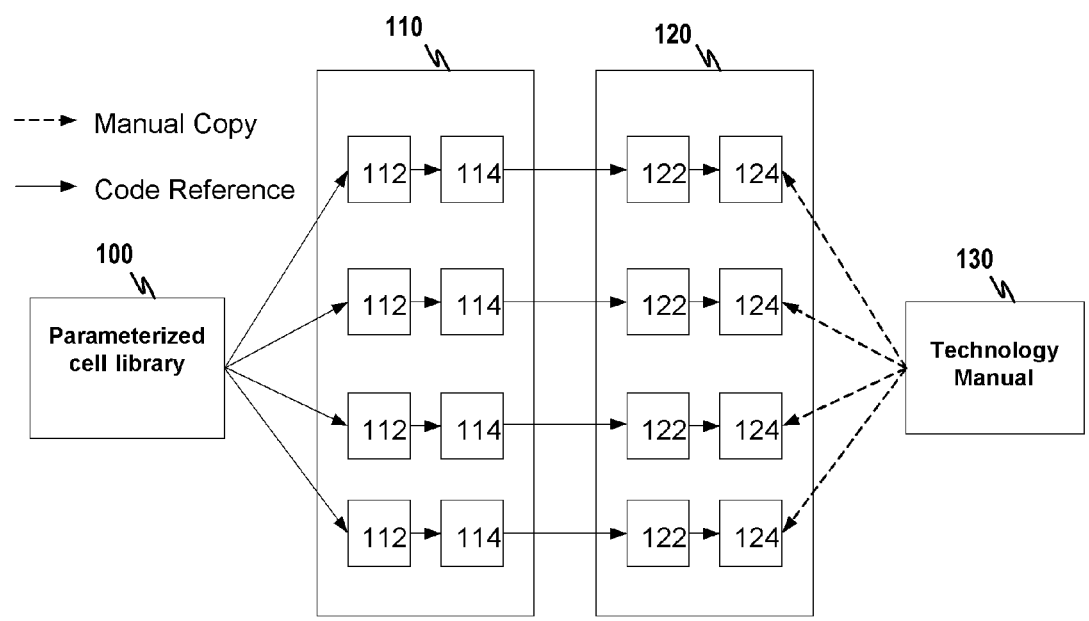
FIG. 1 is an exemplary overview of a dual-layered rule system in accordance with at least one embodiment of the present disclosure.

In accordance with an exemplary embodiment, FIG. 1 describes a 2-layer rule system for migrating an integrated circuit design layout from one technology (e.g., Bulk CMOS) to another technology (e.g., SOI CMOS). In accordance with an exemplary embodiment, first rule layer 120 may include fields 122 which store rule names corresponding to rules of a technology, and the rule names stored in fields 122 may reference the corresponding values stored in fields 124. The values stored in fields 124 may be derived from technology manual 130. Technology manual 130 may include rules which define technologies such as Bulk CMOS, SOI CMOS, etc. Values stored in field 124 may correspond to rules stored in fields 122 such as, for example, minimum allowed space between two neighboring metal shapes, the minimum allowed extension of one metal shape over another shape of a different layer, the minimum allowed area of a shape of a certain layer, etc., which define an integrated circuit design layout.

Second rule layer 110 may include fields 112 which store internally used rule names (e.g., names assigned by an engineer to refer to corresponding rules in the technology manual), and fields 114 which store rule names derived from technology manual 130. The internally used rule names stored in fields 112 reference corresponding rule names stored in fields 114 which in turn reference corresponding rules stored in fields 122 in first rule layer 120.

In accordance with an exemplary embodiment, first rule layer 110 and second rule layer 120 may each be stored as a fast association table.

Parameterized cell library 100 may include variable names corresponding to characteristics of components of an integrated circuit design. For example, if a circuit includes N different types of inverters, the differences (e.g., different signal driving strengths) may be defined in a parameterized way (e.g., assign a variable to a characteristic to describe it with its value). The variable names from parameterized cell library 100 may reference the values stored in fields 124 in first rule layer 120 via the internally used rule names in fields 112 in second rule layer 110.

Figure 2:
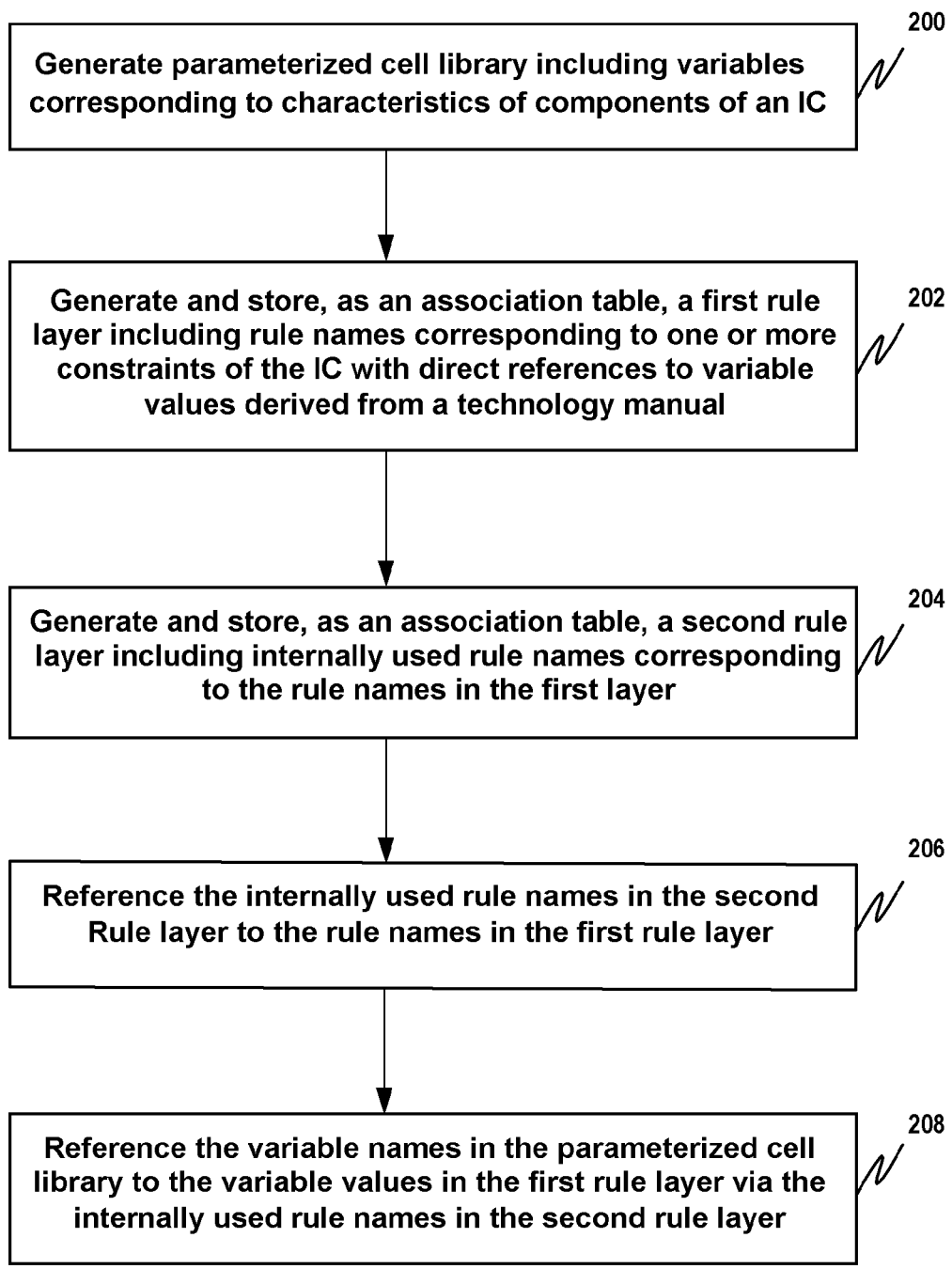
FIG. 2 is an exemplary flowchart for a process of creating a dual-layered rule system in accordance with at least one embodiment of the present invention.

The method for creating a dual-layered rule system for migrating an integrated circuit design layout from one technology to another technology is described below in conjunction with the process illustrated in FIG. 2.

In accordance with an exemplary embodiment, a parameterized cell library including variable names corresponding to characteristics of components of an integrated circuit design is generated in step 200. A first rule layer including rule names corresponding to one or more geometric constraints of the integrated circuit design may be generated and stored as an association table (step 202). The rule names in the first rule layer may directly reference variable values derived from a technology manual. In step 204, a second rule layer including internally used rule names corresponding to the rule names in the first rule layer may be generated and stored as an association table. Storing the rule layers as association tables advantageously provides storage and access to the rule layers in an average O(1) time complexity. Furthermore, one variable name may be used to store each association table. The rules stored in the association tables may be accessed using their respective rule names which may also serve as keys in the association table.

The internally used rule names stored in the second rule layer may reference the corresponding rule names in the first rule layer (step 206). The variable names stored in the parameterized cell library may reference the variable values in the first rule layer via the internally used rule names in the second rule layer (step 208).

In accordance with an exemplary embodiment, the previously described process limits the amount of code changes needed when changing the rules as a result of migrating from one technology to another technology. For example, suppose an integrated circuit design is being migrated from technology tech1 to technology tech2. In tech1, rule GR100 sets the minimum allowed spacing between two neighboring shapes as 0.04 nm (obtained from tech1's technology manual). However, in tech2, rule GR100$a$ sets the minimum allowed spacing between two neighboring shapes as 0.03 nm (obtained from tech2's technology manual). In accordance with an exemplary embodiment, the first rule layer 120 would define GR100=0.04 (i.e., one of the fields 122 would store the rule name as GR100 and one of the fields 124 would store the value as 0.04). The second rule layer 110 would define M1space=GR100 (i.e., one of the fields 112 would store M1space as an internally used rule name and one of the fields 114 would store GR100 as the value). In order to migrate this circuit design from tech1 to tech2, only the rule layers would have to be changed. First rule layer 120 would define GR100$a$=0.03 and second rule layer 110 would define M1space=GR100$a$, along with any other definition that previously relied on GR100. It should be noted that no further changes would be required in the implementation code, since the code only references definitions from the second rule layer.

The exemplary process described above advantageously reduces the number of code changes required when migrating from one technology to another technology. For example, certain prior art methods may require changing of many hard coded variables, which may be difficult to trace. Additionally, it should be noted that in many instances the implementation code may require the definition of physical values that are derived from more than just one technology rule. Thus, certain prior art methods may require referencing multiple technology rule names from within the implementation code just to get one physical value.

It will be appreciated by persons skilled in the art that the present disclosure is not limited to what has been particularly shown and described hereinabove. Rather, the scope of the present disclosure is defined by the claims which follow. It should further be understood that the above description is only representative of illustrative examples of embodiments. For the reader's convenience, the above description has focused on a representative sample of possible embodiments, a sample that teaches the principles of the present disclosure. Other embodiments may result from a different combination of portions of different embodiments.

The description has not attempted to exhaustively enumerate all possible variations. The alternate embodiments may not have been presented for a specific portion of the disclosure, and may result from a different combination of described portions, or that other undescribed alternate embodiments may be available for a portion, is not to be considered a disclaimer of those alternate embodiments. Accordingly, the breadth and scope of the present disclosure should not be limited by any of the above-described exemplary embodiments, but should be defined only in accordance with the following claims and their equivalents.

What is claimed is:

1. A method for creating a dual-layered rule system for migrating an integrated circuit design layout from one technology to another technology, the method comprising:

generating a parameterized cell library including variable names corresponding to characteristics of components of the integrated circuit design;

generating and storing, as an association table, a first rule layer including rule names corresponding to one or more geometric constraints of the integrated circuit design with direct references to variable values derived from a technology manual;

generating and storing, as an association table, a second rule layer including internally used rule names corresponding to the rule names in the first rule layer;

referencing the internally used rule names in the second rule layer to the rule names in the first rule layer;

referencing the variable names from the parameterized cell library to the variable values in the first rule layer via the internally used rule names in the second rule layer.

* * * * *